United States Patent [19]
Bell

[11] Patent Number: 5,586,319
[45] Date of Patent: Dec. 17, 1996

[54] NETLIST EDITOR ALLOWING FOR DIRECT, INTERACTIVE LOW-LEVEL EDITING OF NETLISTS

[75] Inventor: Martin J. Bell, Santa Clara, Calif.

[73] Assignee: VLSI Technology, Inc., San Jose, Calif.

[21] Appl. No.: 281,045

[22] Filed: Jul. 27, 1994

[51] Int. Cl.⁶ ................................................ G06F 15/60
[52] U.S. Cl. .......................... 395/701; 364/490; 364/488; 364/491; 364/474.37
[58] Field of Search ................................. 395/650, 700; 364/490, 491, 488, 474.37

[56] References Cited

U.S. PATENT DOCUMENTS

| | | | |
|---|---|---|---|
| 4,922,432 | 5/1990 | Kobayashi et al. | 364/490 |
| 5,030,907 | 7/1991 | Yih et al. | 324/158 |

*Primary Examiner*—Kevin A. Kriess
*Assistant Examiner*—Majid A. Banankhah
*Attorney, Agent, or Firm*—Burns, Doane, Swecker & Mathis, L.L.P.

[57] ABSTRACT

A custom netlist editor is provided in which low-level netlist editing procedures may be employed by a user to directly modify a netlist in its native format. The custom netlist editor eliminates the need for user to edit netlist cells by hand or by making a new circuit schematic. More particularly, in accordance with one embodiment of the invention, a netlist is interactively edited on a computer using a plurality of defined netlist editing procedures, the netlist representing a circuit in terms of a hierarchy of cell instances, each cell defining a predetermined circuit component, and signal nets connecting the cell instances. A plurality of user commands are defined, each having as a parameter at least one of the following: a cell name, an instance name, and a signal name. A user is prompted for a command, and a user command is input. The user command is executed by calling at least one of the defined netlist editing procedures. The foregoing steps are repeated in an interactive manner until the user quits the custom netlist editor.

9 Claims, 3 Drawing Sheets

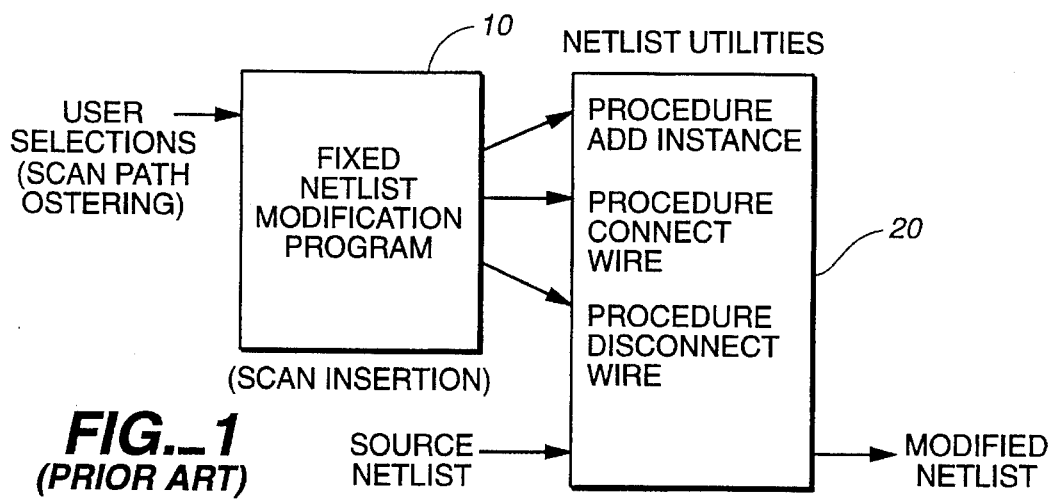
FIG._1
(PRIOR ART)
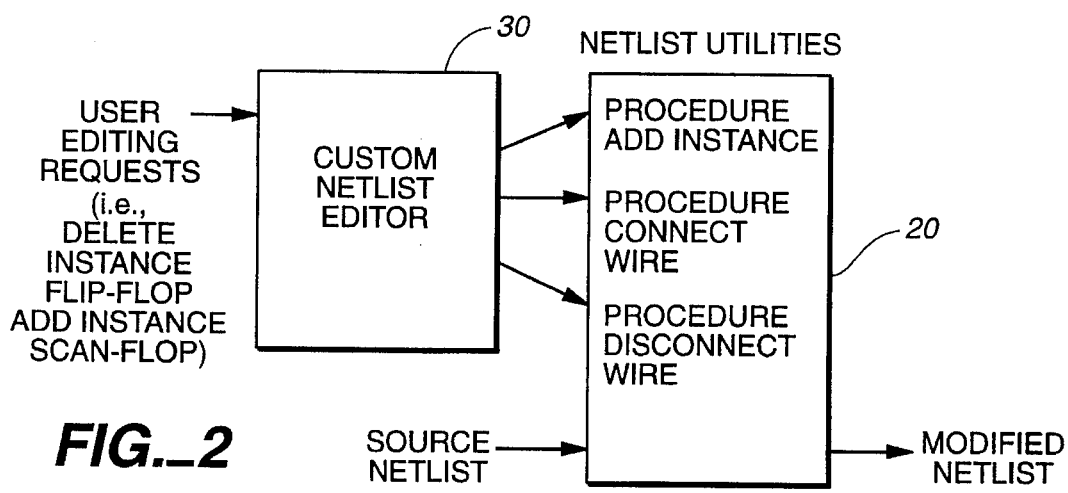
FIG._2
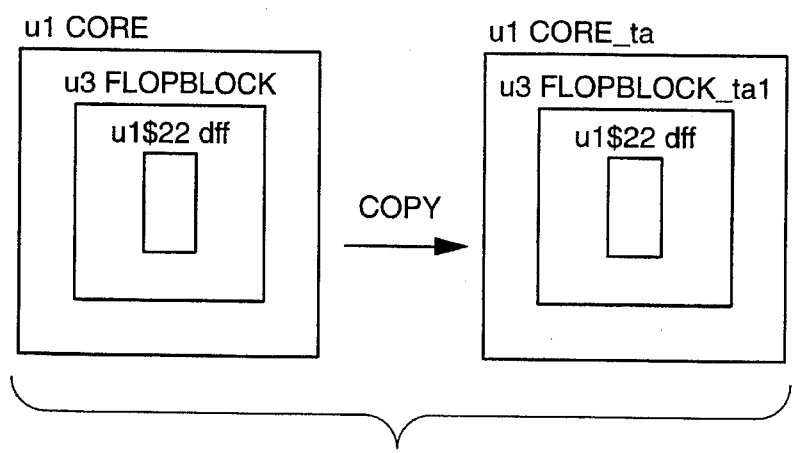
FIG._3

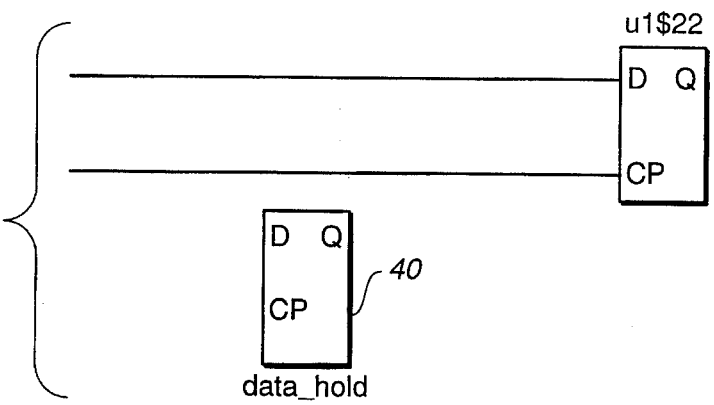
FIG._4
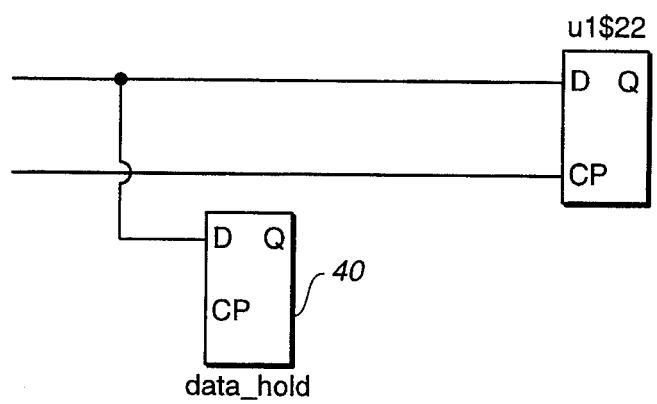
FIG._5
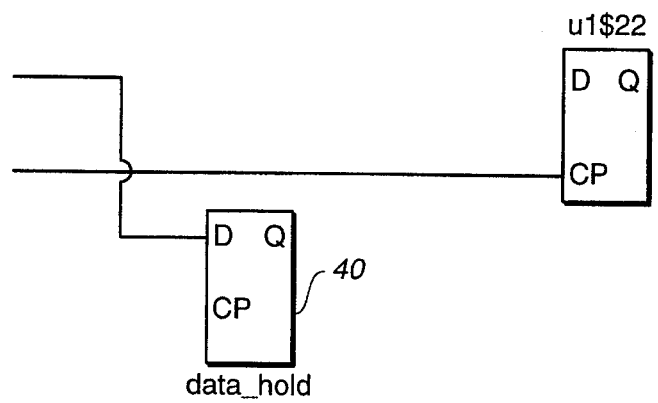
FIG._6
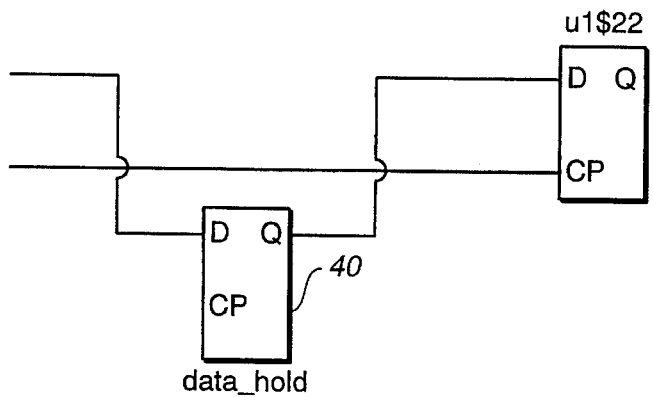
FIG._7

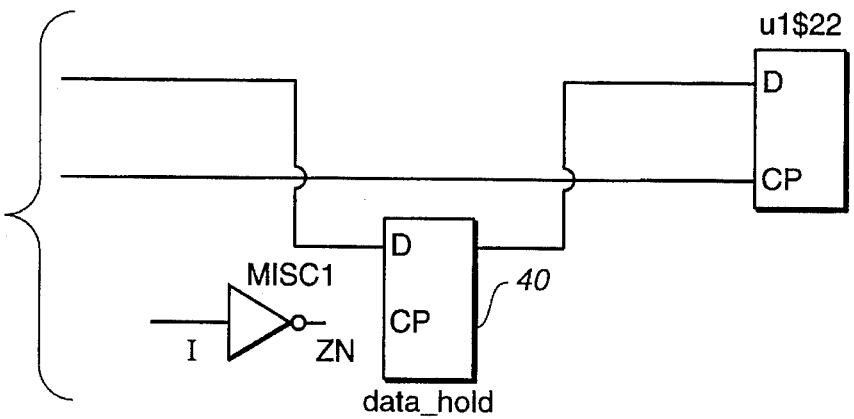
FIG._8
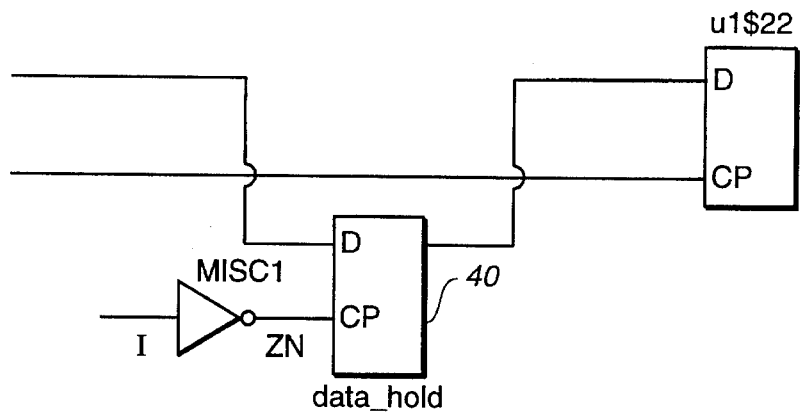
FIG._9
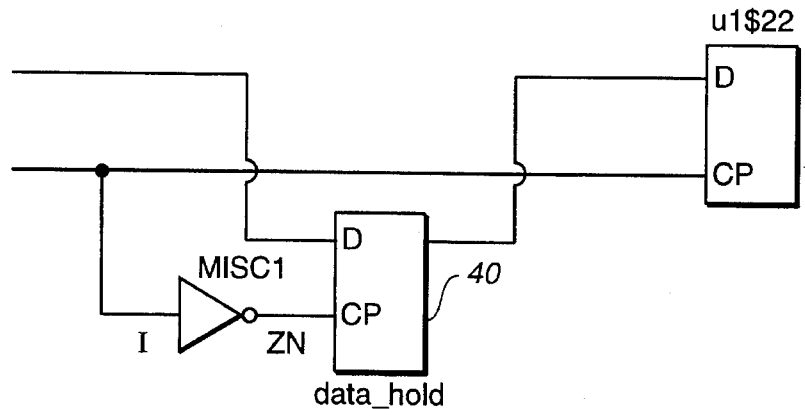
FIG._10

NETLIST EDITOR ALLOWING FOR DIRECT, INTERACTIVE LOW-LEVEL EDITING OF NETLISTS

A portion of this patent document contains material which is subject to copyright protection. The copyright owner has no objection to the facsimile reproduction by any one of the patent disclosure, as it appears in the Patent and Trademark Office patent files or records, but otherwise reserves all copyright rights whatsoever.

BACKGROUND OF THE INVENTION

1. Field of the Invention

The present invention relates to automated integrated circuit design tools, more particularly to netlist editing procedures.

2. State of the Art

In a computer-aided engineering (CAE) environment, integrated circuits are usually created via schematic or a high-level language, such as VHDL, and then translated into a symbolic representation of the integrated circuit in the form of a netlist.

Generally speaking, a netlist provides information concerning the number and types of elements in a circuit and the manner in which they are interconnected. For example, a netlist might include a list of circuit element terminals connected on a common net. Thus, if a first AND gate receives one input from an invertor and a second input from an OR gate, and provides an output to both a NOR gate and a second AND gate, the netlist would indicate that a first net connects an output connector of the invertor and one input connector of the first AND gate. A second net would connect an output connector of the OR gate and another input connector of the first AND gate. Finally, a third net would connect an output connector of the first AND gate, an input connector of the NOR gate, and and input connector of the second AND gate. It should be understood, however, that netlists are not restricted to use in describing logic diagrams. In a netlist, the interconnected circuit elements, typically referred to as cells, may be as simple as a resistor, or as complex as a microprocessor. Furthermore, netlists also contain attribute information, for example how wide a physical wire is to be or how much capacitance is to be allowed on a wire.

One way in which a netlist is generated is as a result of logic synthesis. Stated briefly, a logic synthesis tool may receive as an input a Boolean function expressed in terms of a state table, and generate a netlist including the logic circuits and the interconnections which would implement the given Boolean function.

A netlist could also be produced as an output from a typical datapath compiler. A datapath compiler will usually receive a high-level schematic as an input, and produce a netlist output providing more detailed circuit information. For example, a high-level schematic may include a datapath element such as a scan logic chain. The datapath compiler may produce a standard netlist representing a scan logic chain, which standard netlist would be incorporated into the netlist of the overall circuit.

Often, circuit changes must be made to the netlist. These changes may be needed due to last-minute changes to the function of the circuit, special testability logic, clock skew requirements, or other reasons.

Conventionally, there are three alternative method for modifying a netlist:

1) Change the original source (e.g., the schematic or VHDL specification) and generate a new netlist. This option is not always practical because optimizations and modifications may have already been performed on the netlist before the need for custom modification arises. For example, a design tool may have been used to automatically insert test logic into a circuit. Reverting to the original schematic or VHDL specification would cause such changes to be lost.

2) Use a design tool (such as a MakeSchematic tool available from COMPASS Design Automation of San Jose, Calif.) to translate the netlist into a schematic, change the schematic, and generate a new netlist. The problem with this approach is that the resulting schematic is invariably crowded and extremely difficult to manipulate. Furthermore, making a schematic from a large netlist is not always possible.

3) Edit the netlist using a text editor. Such editing is very prone to error. The netlist format is often undocumented, requiring considerable guesswork. A simple typing mistake may result in the entire netlist being corrupted.

Many CAE vendors have software tools that interact with the netlist. Such programs have their own internal netlist editing programming functions. One such tool is Test Assistant, available from COMPASS. The CAD Framework Initiative (CFI) defines an interface standard for interfacing between netlist editing procedures and CAE programs. Existing netlist editing procedures, however, have been used only inside design programs in a manner dictated by the program.

This situation is illustrated in FIG. 1. A program 10 (such as Test Assistant) provides for netlist modification in response to user selections. The user selections are limited to a high level, however, and the resulting netlist modifications performed are fixed by the program. For example, in Test Assistant, a user may select scan path ordering, in response to which Test Assistant automatically performs scan logic insertion. To perform scan logic insertion, Test Assistant calls upon a collection of netlist editing procedures (or netlist utilities), including, for example, such procedures as addInstance, connectWire, disconnectWire, etc. These procedures are used to operate upon a source netlist in accordance with the fixed netlist modification program to produce a modified netlist.

After the fixed netlist modification program has been run, the user may in some instances need to add custom logic, modify clock trees, or otherwise modify the netlist. However, the user is not allowed to "bypass" the fixed netlist modification program in order to modify the netlist directly using low-level netlist editing procedures. "Tweaking" the netlist has therefore been problematic.

SUMMARY OF THE INVENTION

The present invention, generally speaking, provides a custom netlist editor in which low-level netlist editing procedures may be employed by a user to directly modify a netlist in its native format. The custom netlist editor eliminates the need for user to edit netlist cells by hand or by making a new circuit schematic. More particularly, in accordance with one embodiment of the invention, a netlist is interactively edited on a computer using a plurality of defined netlist editing procedures, the netlist representing a circuit in terms of a hierarchy of cell instances (each cell defining a predetermined circuit component) and signal nets connecting the cell instances. A plurality of user commands are defined, each having as a parameter at least one of the following: a cell name, an instance name, and a signal name. A user is prompted for a command, and a user command is input. The user command is executed by calling at least one of the defined netlist editing procedures. The foregoing steps are repeated in an interactive manner until the user quits the custom netlist editor.

BRIEF DESCRIPTION OF THE DRAWING

The present invention may be further understood from the following description in conjunction with the appended drawing. In the drawing:

FIG. 1 is a block diagram representation of a conventional manner in which a netlist is modified by a fixed netlist modification program using a collection of netlist edition procedures;

FIG. 2 is a block diagram representation of a custom netlist editor in accordance with the present invention, in which low-level netlist editing procedures may be employed by a user to directly modify a netlist in its native format;

FIG. 3 is a diagram showing the effect of the makeHierarchyUnique command in the editing session example set forth in the following Detailed Description;

FIG. 4 is a diagram showing the effect of the addInstance command in the editing session example set forth in the following Detailed Description;

FIG. 5 is a diagram showing the effect of the connect command in the editing session example set forth in the following Detailed Description;

FIG. 6 is a diagram showing the effect of the disconnect command in the editing session example set forth in the following Detailed Description; and FIG. 7, FIG. 8, FIG. 9 and FIG. 10 are are diagrams showing the effects of further commands in the editing session example set forth in the following Detailed Description.

DETAILED DESCRIPTION OF THE PREFERRED EMBODIMENTS

Referring to FIG. 2, the present custom netlist editor 30 provides a user direct access to a netlist utilities module 20 in an interactive environment. The netlist utilities module 20 may include identical netlist editing procedures as known in the prior art (i.e., addInstance, connectWire, disconnectWire, etc.). However, instead of being hidden behind a fixed netlist-modification front-end program (10 in FIG. 1), the custom netlist editor 30 provides a shell user interface to the netlist editing procedures 20. The custom netlist editor 30 responds to user editing requests (as opposed to high-level user selections in FIG. 1) by calling the appropriate netlist editing procedure to directly modify the netlist in its native format.

For example, a user may wish to replace an ordinary flip-flop with a scannable flip-flop for test purposes. The ordinary flip-flop and the scannable flip-flop would be compiled as cells in a cell library identified by respective cell names, for example "flip-flop" and "scan-flop". Using the custom netlist editor, the user may perform the modification using the commands <deleteInstance flip-flop> and <addInstance scan-top>, together with other commands to connect the scannable flip-flop to other circuit elements.

Within the interactive environment provided by the custom netlist editor, the user can perform the same kinds of operations as using the fixed netlist modification program, although it may require many editing commands. In fact, any netlist may be transformed into any other netlist. Typically, however, the custom netlist editor will be used to augment a fixed netlist modification program in the following manner. Using scan insertion as an example, the user will first run a scan insertion program to perform normal scan insertion. Afterward, the user may use the custom netlist editor to undo, if necessary, selected modifications performed by the scan insertion program and make any new custom connections that may be required.

The following description explains in detail the various commands available to the user in a preferred embodiment of the custom netlist editor. Not all of the commands are strictly required, and other commands may be added if desired. The described command set should therefore be understood as being strictly exemplary. In the following description, "parentCell" is used to refer to a cell that contains another cell. For example, a chip may have a core u1 and a flip-flop within the core called u5. The flip-flop is instance u1.u5 and its parentCell is the core u1.

General Edit Commands

MAKEHIERARCHYUNIQUE <hierInst>

This command traverses a hierarchical instance path within the netlist and uniquely renames all parent cells such that their new names are not used anywhere else in the chip. Once a cell is renamed, it will not be renamed again, so there is no penalty for executing makeHierarchyUnique multiple times with the same instance or any other instance in the same parentCell.

MakeHierarchyUnique also opens all parentCells along the hierarchical path for editing. This feature allows other commands, such as joinSignals and raiseBuriedSignal, described hereinafter, to add wires and connectors through the entire hierarchy.

Finally, MakeHierarchyUnique set the current parentCell to the parent of the hierarchical instance hierInst. The user, wishing to edit a cell, first executes makeHierarchyUnique for some instance inside the cell, whereupon the current parentCell is set automatically.

The top hierarchical level, because it is renamed when the netlist is loaded, can be edited without first executing makeHierarchyUnique.

SETPARENTCELL [<cell>]

This command simply opens a parentCell for editing and makes it the current parentCell. This command is used to return to a parentCell that has already been made unique. Omitting the cell parameter causes the top level to be used as the parentCell.

ParentCell Edit Commands

These commands perform editing functions on the current parentCell. The parameter "inst" always refers to a local instance in the parentCell.

ADDCONNECTOR <signal>

This command adds an external connector to the parentCell. The connector will have the same name as the signal. The command addNametoSignal may be used to cause the connector to have a special name.

ADDINSTANCE <inst> <cell> [<tag>]

This command adds a compound [nls] or primitive [mde] instance to the current parentCell. If the cell type is omitted, it is assumed to be [mde]. The optional tag parameter relates to specification of a particular technology.

ADDNAMETOSIGNAL <oldName> <newName>

This command adds a name to a signal. The added name will appear in the netlist. CONNECT <inst> <instConn> <signal>

This command connects a signal to an instance connector.

DELETEINSTANCE <instance>

This command deletes an instance. Signals connected to the instance do not have to be disconnected first.

JOINSIGNALS <sig1> <sig2> [<parent2>]

This command joins two signals together. If the signals are in two different parentCells, supplying the optional argument <parent2> causes both signals to be raised to the top level and connected there.

RAISEBURIEDSIGNAL <sig> [<targParent>]

This command brings a signal to the top level in the netlist hierarchy by adding connectors and signals to all parentCells on the hierarchical path to the top level. If targParent is supplied, the signal will stop at that level instead of the top level.

Control Commands

ABORT

This command aborts without saving the netlist.

QUIT

This command quits the netlist editor and saves the netlist.

Editing Session Example

The following example uses various ones of the foregoing commands to perform insertion of a data-hold flip-flop. The custom netlist editor is assumed to have been entered such that a command prompt ">" is displayed.

```
>makeHierarchyUnique u1.u3.u1$22
   current parent cell:      flopblock_ta1
   instance name:            u1$22
>addInstance data_hold [mde]dfntnb
>connect data-hold D u1$22.D
>disconnect u1$22 D
>connect u1$22 D data_hold.Q
>addInstance misc 1 in01d1
>connect misc1 ZN data_hold.CP
>connect misc1 I u1$22.CP
>quit
   saved cell [nls]flopchip_ta
   saved cell [ta]flopchip
```

The effect of the makeHierarchyUnique command is illustrated in FIG. 3. The hierarchical instance pathname of the D flip-flop u1$22 is originally u1.u3.u1$22. Executing makeHierarchyUnique on this pathname causes a copy to be made of u1$22 and its parentCells, which are renamed u3 flopblock_ta1 and u1 core_ta1, respectively. These parentCells are opened for editing.

Following makeHierarchyUnique, the first step is to add to the netlist the data hold flip-flop. This is accomplished using the addInstance command, the effect of which is illustrated in FIG. 4. The added flip-flop 40 is named "data_hold" and is an instance of the cell "[mde]dfntnb". The next step is then to connect data_hold to the rest of the circuit. The connect and disconnect commands are used for this purpose.

The command connect data_hold D u1$22.D connects the D input of data_hold to the D input of u1$22 as shown in FIG. 5. Next, as shown in FIG. 6, the command disconnect u1$22.D disconnects the D input of u1$22. As a result, what was previously the D input of u1$22 is now instead the D input of data_hold. The Q output of data_hold is then connected to the D input of u1$22 using the command connect u1$22.D data_hold. Q. The result of this command is illustrated in FIG. 7.

The last series of steps connects the clock input of data_hold. First, as shown in FIG. 8, an invertor misc1 (50) is added to the netlist using the command addInstance misc1 in01d1. The output ZN of the invertor 50 is then connected to the clock input of data_hold using the connect command as shown in FIG. 9. Finally, the input I of the invertor 50 is connected to the clock signal of u1$22 using the connect command. Insertion of the dam hold flip-flop is then complete.

Using a series of commands such as in the previous example, the present custom netlist editor is able to transform any netlist into any other netlist in its native format without intermediate levels of transformation and without guesswork of the sort commonly involved in directly editing a netlist. Complete generality and flexibility is thereby achieved while preserving user convenience and ease of use. A program listing of the custom netlist editor in the MainSail programming language is attached as an Appendix to the present Detailed Description.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

APPENDIX

```
###################################################################
# makeHierUnique - Handle makeHierarchyUnique command.
# Calls taedit.transformHierGraph.
###################################################################
procedure makeHierUnique (
  string cmdLine;
);
begin "make hierarchy unique"
  string hierInstance, localInstance;

hierInstance := utscGetToken (cmdLine);
  if NOT checkNullParameter (hierInstance, paramInstanceName) then
    return;

if NOT taUtils.doesHierInstanceExist (hierInstance) thenb "bad inst"
    taui.myErrMsg ("ERROR: Hierarchical instance " & hierInstance &
                   " does not exist.", "TA\0601");
    return;
    end "bad inst";

if NOT taUtils.te.transformHierGraph (hierInstance, parentCell,
                                        localInstance) then
    return;

taui.postText ("   current parent cell: " & parentCell & eol &
```

```
                          "    instance name:      " & localInstance);
end "make hierarchy unique";

###########################################################################
# setParentCell - Handle uniqueHierarchy command.  Null parent gets top-level.
###########################################################################
procedure setParentCell (
  string cmdLine;
);
begin "set parent cell"
  string newParentCell;

if NOT newParentCell := utscGetToken (cmdLine) then
    newParentCell := taUtils.topCellName;

if NOT taUtils.doesCellExist (newParentCell, nlsType) thenb "bad cell"
    taui.myErrMsg ("ERROR: Cell " & pman.makeCellName (newParentCell,nlsType) &
      " does not exist.", "TA\0602");
    return;
    end "bad cell";

if NOT uthsExists (taUtils.te.editedCellHash, newParentCell) thenb
    "not transformed"
    taui.myErrMsg ("ERROR: Cell " & pman.makeCellName (newParentCell,nlsType) &
      " has not been made unique.  You must execute the MakeHierarchyUnique" &
      " command on an instance in that cell first.", "TA\0627");
    return;
    end "not transformed";

if NOT taUtils.te.openCell (newParentCell) then
    return;
  parentCell := newParentCell;
  taui.postText ("    current parent cell: " & parentCell);
end "set parent cell";

###########################################################################
# addConnector - Handle addConnector command.
###########################################################################
procedure addConnector (
  string cmdLine;
);
begin "add connector"
  string signalName;
  long integer signalID;

signalName := utscGetToken (cmdLine);
  if NOT checkNullParameter (signalName, paramSignalName) then
    return;

if NOT signalID := taUtils.getSignalID (parentCell, signalName) thenb
    "new signal"
    taui.myErrMsg ("Warning: Creating signal " & signalName & ".", "TA\0603");
    if NOT signalId := taUtils.te.addSignal (parentCell, signalName) then
      return;
    end "new signal";

taUtils.te.addConnector (parentCell, signalName, signalID);
end "add connector";
```

```
###############################################################################
# addInstance - Handle addInstance command.
###############################################################################
procedure addInstance (
   string cmdLine;
);
begin "add instance"
   string instanceName, cellNameWithType, cellName, cellTag;
   integer cellType;

instanceName := utscGetToken (cmdLine);
   cellNameWithType := utscGetToken (cmdLine);
   cellTag := utscGetToken (cmdLine);

if NOT checkNullParameter (instanceName, paramInstanceName) then
      return;
   if NOT checkNullParameter (cellNameWithType, paramCellName) then
      return;

if NOT pman.parseCellSpecifier (cellNameWithType, cellName, cellType) thenb
      taui.myErrMsg ("ERROR: " & cellNameWithType & " is an illegal cell name.",
         "TA\0604");
      return;
      end
   else if NOT cellName thenb
      taui.myErrMsg ("ERROR: Cell name is null.", "TA\0605");
      return;
      end
   else if cellType
         AND (cellType NEQ mdeType
            AND cellType NEQ nlsType) thenb "wrong type"
      taui.myErrMsg ("ERROR: Cell "
         & pman.makeCellName (cellName, cellType) & " is not [nls] or [mde] type.",
         "TA\0606");
      return;
      end "wrong type";

if NOT cellType then
      cellType := mdeType;

if NOT cellTag
         # Netlists have no tag by default.
         AND cellType NEQ nlsType then
      cellTag := taUtils.logicTag;

if taUtils.doesInstanceExist (parentCell, instanceName) thenb "bad inst"
      taui.myErrMsg ("ERROR: Instance " & instanceName &
         " already exists in parent cell " & parentCell & ".", "TA\0607");
      return;
      end "bad inst";

# Can't addInstance on an open cell.  Let's just be lazy and always close.
   if cellType = nlsType then
      taUtils.te.closeCell (cellName);
   taUtils.te.addInstance (parentCell, instanceName, cellName,
                           cellType, cellTag);
end "add instance";
```

```
##############################################################################
# addSignalName - Handle addNameToSignal command.
##############################################################################
procedure addSignalName (
  string cmdLine;
);
begin "add signal name"
  string oldSignalName, newSignalName;
  long integer signalID;

oldSignalName := utscGetToken (cmdLine);
  newSignalName := utscGetToken (cmdLine);
  if NOT checkNullParameter (oldSignalName, paramSignalName) then
    return;
  if NOT checkNullParameter (newSignalName, paramSignalName) then
    return;

if NOT signalID := taUtils.getSignalID (parentCell, oldSignalName) thenb
    "bad signal"
    taui.myErrMsg ("ERROR: Signal " & oldSignalName &
      " does not exist in parent cell " & parentCell & ".", "TA\0608");
    return;
  end "bad signal";

if taUtils.getSignalID (parentCell, newSignalName) thenb
    "bad signal"
    taui.myErrMsg ("ERROR: Signal " & newSignalName &
      " already exists in parent cell " & parentCell & ".", "TA\0609");
    return;
  end "bad signal";

taUtils.te.addNameToSignal (parentCell, signalID, newSignalName);
end "add signal name";

##############################################################################
# connect - Handle connect command.
##############################################################################
procedure connect (
  string cmdLine;
);
begin "connect"
  string instanceName, connector, signalName;
  long integer signalID;

instanceName := utscGetToken (cmdLine);
  connector := utscGetToken (cmdLine);
  signalName := utscGetToken (cmdLine);
  if NOT checkNullParameter (instanceName, paramInstanceName) then
    return;
  if NOT checkNullParameter (connector, paramConnector) then
    return;
  if NOT checkNullParameter (signalName, paramSignalName) then
    return;

if NOT taUtils.doesInstanceExist (parentCell, instanceName) thenb "bad inst"
    taui.myErrMsg ("ERROR: Instance " & instanceName &
      " does not exist in parent cell " & parentCell & ".", "TA\0610");
    return;
```

```
      end "bad inst";

if NOT taUtils.te.getSignalIDForInstConn (parentCell, instanceName,
                                              connector) thenb
      "bad connector"
      taui.myErrMsg ("ERROR: Connector " & connector &
         " does not exist on instance " & instanceName & " in parent cell " &
         parentCell & ".", "TA\0617");
      return;
      end "bad connector";

if NOT signalID := taUtils.getSignalID (parentCell, signalName) thenb
      "bad signal name"
      taui.myErrMsg ("ERROR: Signal " & signalName &
         " does not exist in parent cell " & parentCell & ".", "TA\0611");
      return;
      end "bad signal name";

taUtils.te.connect (parentCell, instanceName, connector, signalID);
end "connect";

################################################################################
# deleteInstance - Handle deleteInstance command.
################################################################################
procedure deleteInstance (
   string cmdLine;
);
begin "delete instance"
   string instanceName;

instanceName := utscGetToken (cmdLine);
   if NOT checkNullParameter (instanceName, paramInstanceName) then
      return;

if NOT taUtils.doesInstanceExist (parentCell, instanceName) thenb "bad inst"
      taui.myErrMsg ("ERROR: Instance " & instanceName &
         " does not exist in parent cell " & parentCell & ".", "TA\0612");
      return;
      end "bad inst";

taUtils.te.deleteInstance (parentCell, instanceName);
end "delete instance";

################################################################################
# disconnect - Handle disconnect command.
################################################################################
procedure disconnect (
   string cmdLine;
);
begin "disconnect"
   string instanceName, connector;

instanceName := utscGetToken (cmdLine);
   connector := utscGetToken (cmdLine);
   if NOT checkNullParameter (instanceName, paramInstanceName) then
      return;
   if NOT checkNullParameter (connector, paramConnector) then
      return;
```

```
     if NOT taUtils.doesInstanceExist (parentCell, instanceName) thenb "bad inst"
        taui.myErrMsg ("ERROR: Instance " & instanceName &
          " does not exist in parent cell " & parentCell & ".", "TA\0613");
        return;
        end "bad inst";

# Check connector exists
#! change this when nlap starts returning boolean on diconnect fail.
     if NOT taUtils.getSignalID (parentCell, instanceName & "." & connector) thenb
        "bad connector"
        taui.myErrMsg ("ERROR: Connector " & connector & " does not exist on " &
          "instance " & instanceName & " in parent cell " & parentCell & ".",
          "TA\0618");
        end "bad connector";
     taUtils.te.disconnect (parentCell, instanceName, connector);
end "disconnect";

###############################################################################
# joinSignals - Handle joinSignals command.
###############################################################################
procedure joinSignals (
  string cmdLine;
);
begin "join signals"
  string signalName1, signalName2, parentCell2;
  long integer signal1ID, signal2ID;

signalName1 := utscGetToken (cmdLine);
  signalName2 := utscGetToken (cmdLine);
  parentCell2 := utscGetToken (cmdLine);
  if NOT checkNullParameter (signalName1, paramSignalName) then
     return;
  if NOT checkNullParameter (signalName2, paramSignalName) then
     return;
  if NOT parentCell2 then
     parentCell2 := parentCell
  else
     taUtils.te.openCell (parentCell2);

if NOT signal1ID := taUtils.getSignalID (parentCell, signalName1) thenb
     "bad signal"
     taui.myErrMsg ("ERROR: Signal " & signalName1 &
       " does not exist in parent cell " & parentCell & ".", "TA\0614");
     return;
     end "bad signal";

if NOT signal2ID := taUtils.getSignalID (parentCell2, signalName2) thenb
     "bad signal"
     taui.myErrMsg ("ERROR: Signal " & signalName2 &
       " does not exist in parent cell " & parentCell2 & ".", "TA\0615");
     return;
     end "bad signal";

taUtils.te.joinSignals (parentCell, parentCell2, signal1ID, signal2ID);
end "join signals";

###############################################################################
```

```
# raiseBuriedSignal - Handle raiseBuriedSignal command.
##################################################################
procedure raiseBuriedSignal (
  string cmdLine;
);
begin "raise buried signal"
  string signalName, targetParent, instance, instConn;
  long integer signalID;

signalName := utscGetToken (cmdLine);
  targetParent := utscGetToken (cmdLine);
  if NOT checkNullParameter (signalName, paramSignalName) then
    return;

if NOT signalID := taUtils.getSignalID (parentCell, signalName) thenb
    "bad signal"
    taui.myErrMsg ("ERROR: Signal " & signalName &
      " does not exist in parent cell " & parentCell & ".", "TA\0616");
    return;
    end "bad signal";

if NOT taUtils.te.raiseBuriedSignal (parentCell, signalID, instance,
                                       instConn, targetParent) then
    return;

if NOT targetParent then
    targetParent := taUtils.topCellName;
  signalID := taUtils.te.getSignalIDforInstConn (targetParent, instance,
                                                 instConn);
  signalName := taUtils.getSignalName (targetParent, signalID);
  taui.postText ("    raised signal:       " & signalName & eol &
                 "    signal parent cell: " & targetParent);
end "raise buried signal";

IFC dcl (v8ToolsVersion) THENC
##################################################################
# getLine - Gets a command line from the user interface.
##################################################################
string procedure getline (
  string promptString
);
begin "get line"
  string sl, t;

sl := "";
  do if eof (cmdfile) then
    return (sl)
  eb
    uiapwritelogfile (if sl then " ....> " else promptString);
    read (cmdfile, t);
    utscRemoveLeadingBlankSpace (t);
    utscRemoveTrailingBlankSpace (t);
    sl .& t;
    utscRemoveTrailingBlankSpace (sl);
    if first (sl) = '#' then
      sl := ""
    ef last (sl) = '-' then
      rcread (sl) # Strip the continuation character and keep reading.
    eb
```

```
         if s1 AND first (s1) neq '#' then
           return (s1)
         else
           s1 := "";
         end;
       end;
end "get line";

###############################################################################
# runEditor - Runs a shell interface netlist editor.  FALSE is returned if the
# user didn't like what he did and doesn't want the netlist saved.
###############################################################################
boolean procedure runEditor (
   pointer (taUtilClass) taUtilIn;    # utility routines and data
);
begin "run editor"
   string array (1 to *) Cmds;
   string cmdline, promptstring, instance, instConn;
   integer com;

DEFINE
   cmdJoin = eol & "                               ";
#! 6/4/93 mabell - Use this to implement options or SHOW command.
#   declcmd(cmds, optionCom,
#     "OPTION <optName> on|of    enter ""option ?"" to list options");

#   new(optionList,1,2);
#   new(optionBits,1,2);
#   init optionList (
#   "Noisy                    reports cpu times and files generated (def = ON)",
#   "WatchInternals           lists internal nodes in the result (def= OFF)");
#   init optionBits (opNoisy,opWatchInternals);

#       [optionCom]  vfutl.setOptions(optionList,optionBits,theline,options);
#   integer opt;
#   boolean isOn;
#   opt:=scaner.doStringCmdMatch(theLine,optionList,theLine,"COMPASSvector.opt> "
#       nullarray,nullarray,false,true);
#   if 1 <= opt <= optionList.ubl then begin
#     if not getOnoff(theline,isOn) then return;
#     if isOn then options .ior optionBits[opt]
#     else options .clr optionBits[opt];
#   end;

taUtils := taUtilIn;
   uthsNew (testPointHash);
   taUtils.drv.initialize (taUtils);
   nextTP := 1;
   parentCell := taUtils.topCellName;
   taui.postText ("    current parent cell: " & parentCell);

Startcmd (Cmds);
   declcmd (Cmds, abortCom,
     "Abort                  Abort without saving netlist");
   declcmd (Cmds, addConnCom,
     "AddConnector <signal>   Adds an external connector to parentCell");
   declcmd (Cmds, addInstCom,
     "AddInstance <inst> <cell> [<tag>]" & cmdJoin
     & "Adds [nls] or [mde] cell instance.");
```

```
declcmd (Cmds, addSigNameCom,
  "AddNameToSignal <oldName> <newName>");
declcmd (Cmds, connectCom,
  "Connect <inst> <instConn> <signal>");
declcmd (Cmds, delInstCom,
  "DeleteInstance <inst>");
declcmd (Cmds, disconnectCom,
  "Disconnect <inst> <instConn>" & cmdJoin
  & "Disconnects all signals from instConn");
declcmd (Cmds, joinCom,
  "JoinSignals <sig1> <sig2> [<parent2>]" & cmdJoin
  & "Joins two signals together. If parentCell2 for sig2" & cmdJoin
  & "is different from parentCell the connection will be" & cmdJoin
  & "made at the top level.");
declcmd (Cmds, makeHierUniqueCom,
  "MakeHierarchyUnique <hierInst>" & cmdJoin
  & "Renames and opens all parentCells of inst. This" & cmdJoin
  & "command must be executed on a hier instance contained" & cmdJoin
  & "in a parentCell before any parentCell edit command" & cmdJoin
  & "is executed.");
declcmd (Cmds, quitCom,
  "Quit             Quit netlist editor");
declcmd (Cmds, raiseCom,
  "RaiseBuriedSignal <sig> [<targParent>]" & cmdJoin
  & "Bring a signal up to top level. If targParent is" & cmdJoin
  & "supplied, the signal will stop at that level.");
declcmd (Cmds, setParentCom,
  "SetParentCell [<cell>]   Opens parentCell for edit");

if taUtils.bstFlags TST tabstFlagScanBIST
   AND taUtils.scanFlags TSTA tascanFlagAddCells!tascanFlagAddPaths thenb
   # Enable test point insertion commands.
   declcmd (Cmds, setControlCellCom,
     "SetControlCell <tpCell> <ckConn> <tmConn> <SIconn> <SOconn> "
     & "<DIconn> <DOconn>");
   declcmd (Cmds, setObserveCellCom,
     "SetObserveCell <tpCell> <ckConn> <smConn> <SIconn> <SOconn> "
     & "<DIconn>");
   declcmd (Cmds, wireTestPointCom,
     "WireTestPoint <tpCell> <hierDrivingInstance> <sysSignal> " &
     "[<flatClockSignal>]" & eol &
     "                  [<beforeHierFlop>]");
   # Create driver for test mode signal.  Same as clock mux select.
   taUtils.te.raiseBuriedSignal (taUtils.testLogicCell,
     taUtils.te.getSignalIDforInstConn (taUtils.testLogicCell,
       taUtils.bstControllerInstance,
       tabst.bstContConnNameFromFunction (taUtils, tabstConnScanInstr)),
     instance, instConn);
   taUtils.drv.defineTAsignalName (tahackScanDrv,
     taUtils.te.getSignalIDforInstConn(taUtils.topCellName,instance,instConn));
end;

promptstring := fdti.companyprompt & "TestAsst.edit> ";
while cmdline := getline (promptstring) dob "get a command"
   com := scaner.doStringCmdMatch (cmdLine, cmds, cmdLine, promptstring,
                                   nullarray, nullarray, FALSE, TRUE);
   case com ofb "case"
     [abortCom] if taui.requestConfirm ("Abort editing and discard " &
                                        "netlist changes?") then
                   return (FALSE);
```

```
      [addConnCom] addConnector (cmdLine);
      [addInstCom] addInstance (cmdLine);
      [addSigNameCom] addSignalName (cmdLine);
      [connectCom] connect (cmdLine);
      [delInstCom] deleteInstance (cmdLine);
      [disconnectCom] disconnect (cmdLine);
      [joinCom] joinSignals (cmdLine);
      [makeHierUniqueCom] makeHierUnique (cmdLine);
      [quitCom] done "get a command";
      [raiseCom] raiseBuriedSignal (cmdLine);
      [setParentCom] setParentCell (cmdLine);
      [setControlCellCom] setTestPoint (cmdLine, tahackControlType);
      [setObserveCellCom] setTestPoint (cmdLine, tahackObserveType);
      [wireTestPointCom] wireTestPoint (cmdLine);
      [];
      end "case";
    end "get a command";

taUtils.drv.wireAllDriverTrees;
  uthsDispose (testPointHash);
  return (TRUE);
end "run editor";

ELSEC
#################################################################################
# initV9Editor - Initializes editor for V9 tashell to call command parsing.
#################################################################################
procedure initV9Editor (
  pointer (taUtilClass) taUtilIn;   # utility routines and data
);
begin "init V9 editor"
  taUtils := taUtilIn;
  parentCell := taUtils.topCellName;
  taui.postText ("   current parent cell: " & parentCell);
end "init V9 editor";
ENDC
```

What is claimed is:

1. A method of interactively editing a netlist on a computer using a set of predefined netlist editing procedures, the netlist representing a circuit in terms of a hierarchy of cell instances having instance connectors, each cell defining a predetermined circuit component, and signal nets connecting the cell instances between instance connectors, the method comprising the steps of:

a) defining a set of user commands each having as a parameter at least one of the following: a cell name, an instance name, an instance connector name, and a signal name;

b) prompting a user for a command;

c) inputting a user command;

d) executing the user command by calling at least one of said predefined netlist editing procedures; and e) repeating steps b), c) and d).

2. The method of claim 1 wherein said plurality of user commands includes an addInstance command that adds an instance of a specified cell to the netlist.

3. The method of claim 2 wherein the addInstance command has as parameters an instance name and a cell name.

4. The method of claim 2 wherein said plurality of user commands includes an deleteInstance command that deletes an instance of a cell from the netlist.

5. The method of claim 4 wherein the deleteInstance command has as a parameter an instance name.

6. The method of claim 4 wherein said plurality of user commands includes a connect command that connects a signal net to an instance connector of an instance.

7. The method of claim 6 wherein the connect command has as parameters an instance name, an instance connector name, and a signal name.

8. The method of claim 6 wherein said plurality of user commands includes a disconnect command that disconnects all signal nets connected to a specified instance connector of an instance.

9. The method of claim 8 wherein the disconnect command has as parameters an instance name and an instance connector name.

* * * * *

UNITED STATES PATENT AND TRADEMARK OFFICE

CERTIFICATE OF CORRECTION

PATENT NO.   : 5,586,319
DATED        : December 17, 1996
INVENTOR(S)  : Bell, Martin J.

Column 3, line 63, change "scan-top" to --scan-flop--.

Column 4, line 25, change " <hierInst> " to -- <hierInst> --.

Column 5, line 10, the word "CONNECT" should begin a new paragraph.

Column 6, line 38, change the word "dam" to --data--.

Signed and Sealed this

First Day of April, 1997

*Attest:*

BRUCE LEHMAN

*Attesting Officer*   *Commissioner of Patents and Trademarks*

UNITED STATES PATENT AND TRADEMARK OFFICE
CERTIFICATE OF CORRECTION

PATENT NO. : 5,586,319

DATED : December 17, 1996

INVENTOR(S) : Bell, Martin J.

It is certified that error appears in the above-indentified patent and that said Letters Patent is hereby corrected as shown below:

Spelling of the word "ordering" has been corrected. Figure 1 is as shown below.

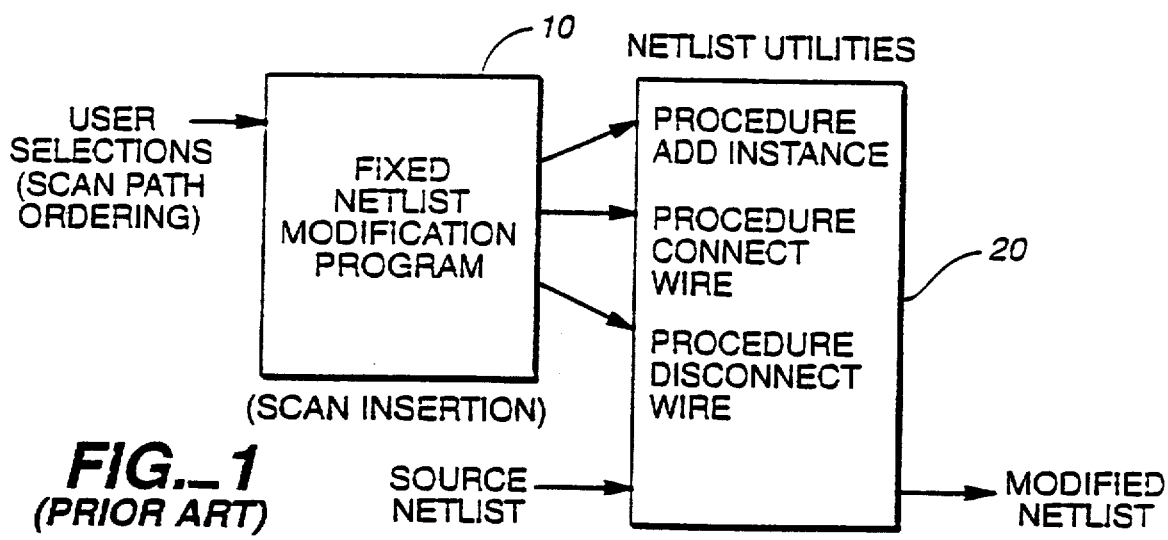

FIG._1
(PRIOR ART)

UNITED STATES PATENT AND TRADEMARK OFFICE
CERTIFICATE OF CORRECTION

PATENT NO. : 5,586,319

DATED : December 17, 1996

INVENTOR(S) : Bell, Martin J.

It is certified that error appears in the above-indentified patent and that said Letters Patent is hereby corrected as shown below:

Column 4, line 39, change "set" to --sets--.

Signed and Sealed this

Twenty-second Day of April, 1997

Attest:

Attesting Officer

BRUCE LEHMAN

*Commissioner of Patents and Trademarks*